United States Patent [19]
Watt

[11] Patent Number: 5,623,156
[45] Date of Patent: Apr. 22, 1997

[54] ELECTROSTATIC DISCHARGE (ESD) PROTECTION CIRCUIT AND STRUCTURE FOR OUTPUT DRIVERS

[75] Inventor: Jeffrey Watt, Mountain View, Calif.

[73] Assignee: Cypress Semiconductor Corporation, San Jose, Calif.

[21] Appl. No.: 535,426

[22] Filed: Sep. 28, 1995

[51] Int. Cl.$^6$ .................................................. H01L 23/62
[52] U.S. Cl. ........................... 257/355; 257/173; 257/174; 257/297; 257/328; 257/357; 257/358; 257/360; 257/363; 257/546
[58] Field of Search ................................. 257/173, 174, 257/297, 328, 355, 357, 358, 360, 363, 546

[56] References Cited

U.S. PATENT DOCUMENTS

| | | |
|---|---|---|
| 4,990,802 | 2/1991 | Smooha . |
| 5,019,888 | 5/1991 | Scott et al. . |
| 5,043,782 | 8/1991 | Avery ......................................... 257/355 |
| 5,140,401 | 8/1994 | Ker et al. . |
| 5,182,220 | 1/1993 | Ker et al. . |
| 5,218,222 | 6/1993 | Roberts . |
| 5,289,334 | 2/1994 | Ker et al. . |
| 5,329,143 | 7/1994 | Chan et al. . |

OTHER PUBLICATIONS

EOS/ESD Symposium "Sub–Micron Chip ESD Protection Schemes Which Avoid Avalanching Junctions", E.R. Worley, et al., pp. 1.2.1–1.2.8 no date.

IEEE/IRPS (1987); "ESD Phenomena and Protection Issues in CMOS Output Buffers"; Duvvury, et al.; pp. 174–180, Jan.

IEEE Transactions of Electron Devices, vol. 35, No. 12, Dec. 1988; "Internal Chip ESD Phenomena Beyond the Protection Circuit"; Duvvury, et al.; pp. 2133–2138.

EOS/ESD Symposium Proceedings Jan. (1989); "Improving the ESD Failure Thershold of Silicided nMOS output Transistors by Ensuring Uniform Current Flow"; Polgreen, et al.; pp. 168–174.

IEEE Electron Device Letters, vol. 12, No. 1; Jan. 1991; "A Low–Voltage Triggering SCR for On–Chip ESD Protection at Output and Input Pads"; Chatterjee; pp. 21–22.

IEEE Jan. (1992); "Achieving Uniform nMOS Device Power Distribution for Sub–Micron ESD Reliability"; Duvvury, et al.; pp. 92–134.

EOS/ESD Symposium; "ESD Protection in a Mixed Voltage Interface and Multi–Rail Disconnected Power Grid Environment in 0.50–and 0.25 mu m Channel Length CMOS Technologies"; Voldman; pp. 94–125—94–134, Jan. 1994.

(List continued on next page.)

*Primary Examiner*—Edward Wojciechowicz
*Attorney, Agent, or Firm*—Barnes, Kisselle, Raisch, Choate, Whittemore & Hulbert P.C.

[57] ABSTRACT

An integrated circuit device includes internal power supply buses $V_{SSI}$, and $V_{DDI}$, and output power supply buses $V_{SSO}$, and $V_{DDO}$. An output driver of the device has an active p-channel pull up, and n-channel pulldown complementary pair configuration with their outputs tied to a common node, which is in turn tied to an I/O pad. A protection circuit for protecting the device from ESD events includes a series resistor disposed between the source of the n-channel pulldown transistor, and power supply bus $V_{SSO}$. The protection circuitry includes a diode having its cathode connected to the I/O pad, and its anode connected to power supply bus $V_{SSI}$. The pulldown transistor includes an n$^+$ drain region, which is shared with the diode, wherein the diode and transistor are merged. The resistor between the pulldown transistor source, and power supply $V_{SSO}$ permits maintaining this merged structure. In an alternate embodiment, an n-well may be formed to underlie the p$^+$ anode of the diode, and wholly surround it. The n-well extends toward and contacts the n$^+$ drain region of the pulldown FET. The n-well isolates the p$^+$ region from the substrate, permitting the p$^+$ region to be connected to the power supply bus $V_{SSO}$ thereby eliminating the requirement that a metal power supply bus $V_{SSI}$ be routed into the I/O portion of the device.

20 Claims, 6 Drawing Sheets

OTHER PUBLICATIONS

EOS/ESD Symposium; "Core Clamps for Low Voltage Technologies"; Dabral, et al.; pp. 94-141—94-149, Jan. 1994.

IEEE (1994); "Mixed-Voltage Interface ESD Protection Circuits for Advanced Microprocessors in Shallow Trench and LOCOS Isolation CMOS Technologies"; Voldman, et al.; pp. 94-141—94-149, Jan. 1994.

ELECTROSTATIC DISCHARGE (ESD) PROTECTION CIRCUIT AND STRUCTURE FOR OUTPUT DRIVERS

BACKGROUND OF THE INVENTION

1. Field of the Invention

The present invention relates generally to protection devices, and, more particularly, to protection devices for protecting integrated circuit devices from electrical transients, including electrostatic discharge (ESD) events.

2. Description of the Related Art

Integrated circuit devices have been subject to ever increasing susceptibility to damage from application of excessive voltages, for example, by electrostatic discharge (ESD) events. This susceptibility is due, in large part, to the ever decreasing gate oxide thicknesses which have resulted as very large scale integration (VLSI) circuit geometries continued to shrink. In particular, during an ESD event, charge is transferred between one or more pins of the integrated device and another conducting object in a time period that is typically less than one microsecond. As indicated above, this charge transfer can generate voltages that are large enough to break down insulating films (e.g., gate oxides) on the device or can dissipate sufficient energy to cause electrothermal failures in the device. Such failures include contact spiking, silicon melting, or metal interconnect melting.

Accordingly, there have been many attempts made in the prior art to protect semiconductor devices, with particular attention to the problem of protecting field effect transistor devices from such ESD events. FIG. 1 is representative of a common approach taken in the prior art to protect integrated circuit devices. An input/output circuit, including protection circuitry, is indicated generally at 10 and is provided for protecting an input buffer 12, and an output buffer 14, from ESD events occurring at input/output (I/O) pad 16. Circuit 10 includes a primary ESD protection circuit 18, a secondary ESD protection circuit 20, a core clamp 22, and ESD clamps 24, and 26.

In addition to the basic protection circuits, an integrated circuit device may have separate power supply buses for output drivers and internal circuits. Separate buses have the effect of reducing noise generated by the output drivers (because of large current transients) from appearing on the power supply buses provided for the internal circuits. The positive output power supply bus is indicated at $V_{DDO}$, while the negative output power supply bus is denoted $V_{SSO}$. The internal power supply buses are indicated at $V_{SSI}$ and $V_{DDI}$. These power supply buses may be shorted together on the die, or, on the package of the semiconductor device. In some cases, there may only be a single pair of power supplies, $V_{SS}$ and $V_{DD}$, which are used for both output drivers and internal circuits.

Protection circuits, such as those found in structure 10, are usually connected to all I/O pads of an integrated circuit to safely dissipate the energy associated with ESD events. This energy dissipation prevents, generally, damage to all the internal circuitry, such as input buffer 12, or output buffer 14, that is connected to I/O pad 16. The double diode primary ESD circuit 18 includes diodes $D_1$, and $D_2$, and is connected between $V_{DDO}$ and $V_{SSO}$, with input pad 16 being connected at a node common to diodes $D_1$ and $D_2$. The primary ESD circuit 18 carries the majority of the charge during an ESD event. In particular, diode $D_1$ shunts ESD charge to the $V_{SSI}$ bus when the polarity is negative, while diode $D_2$ shunts ESD charge to the $V_{DDO}$ bus when the polarity is positive. Secondary ESD protection circuit 20 includes a resistor R in series with a grounded gate FET clamp $M_O$, which is operative to limit the voltage across the gate oxides of input buffer 12. The amount of charge that flows through secondary ESD protection circuit 20 is relatively small in comparison to the amount of charge flowing through primary ESD protection circuit 18. Core clamp 22 permits charge to be transferred between the internal power supply buses $V_{DDI}$ and $V_{SSI}$ during an ESD event. ESD clamps 24, and 26 are placed between each pair of $V_{SS}$, and $V_{DD}$ supplies to allow charge to be transferred between the power supply buses during an ESD event.

A particularly significant problem encountered in the art relates generally to protecting output driver 14 from damage due to ESD events. Protection circuits similar to input protection circuits may not be employed, generally, at outputs because design constraints do not permit the use of a resistance between the output buffer and the interface pad. As shown in FIG. 1, output driver 14 includes an active p-channel pullup device 30, and an n-channel pulldown device 28 connected between $V_{DDO}$ and $V_{SSO}$. The use of silicided source/drain diffusions have only exacerbated the ESD protection problem.

A better understanding of the problems existent in the prior art may be had by reference to FIG. 2. At the outset, it should be noted that a commonly employed architecture in the design of output driver 14 is the use of a plurality of individual pulldown n-channel field effect transistors (FETs) for pulldown device 28. That is, the device 28 shown schematically in FIG. 1 as a single transistor, is, as actually fabricated, a plurality of individual transistors $28_1$, $28_2$, ... $28_N$, connected in parallel (i.e., gate electrodes tied; source electrodes tied; and drain electrodes tied). This arrangement is also known as a so-called "multi-finger" architecture, each FET being a "finger." Diode $D_2$ is merged with the drain of p-channel pullup output driver FET 30, and can be connected to $V_{DDO}$, since FET 30, and diode $D_2$ are placed in an n-well in a p-type substrate, which is electrically isolated from other such n-wells connected to $V_{DDI}$ (this merged configuration is not shown). As mentioned above, isolation is required to maintain the internal power supply buses "clean" relative to the "dirty" output power supply buses.

FIG. 2 shows a portion of output driver 14 fabricated on a p-type conductivity substrate 32. Device 28 includes a plurality of n-channel FETs $28_1$, $28_2$, ... $28_N$. FET $28_1$ includes a source region, such as $n^+$-type conductivity region $34_1$, a drain region, such as $n^+$-type conductivity region $36_1$, gate oxide $38_1$, and a gate electrode, such as polycrystalline silicon ("poly") gate electrode $40_1$. N-channel pulldown FET $28_2$ is identical. Diode $D_1$ includes a $p^+$-type conductivity region 42 and is merged with drain 36 of n-channel pulldown FET 28; it must therefore be connected to power supply bus $V_{SSI}$ to avoid shorting it to the output power supply bus $V_{SSO}$ through p-type substrate 32. A layout view corresponding to this structure is shown in FIG. 3.

A major problem in the prior art is that n-channel pulldown device 28 can "snapback" and fail during a positive polarity ESD event with respect to $V_{SS}$. The desired path for charge in this type of ESD event is through diode $D_2$ to $V_{DDO}$, and then through the power supply ESD protection structures (i.e., 22, 24, 26) to one of the $V_{SS}$ buses. However, if the voltage on pad 16 increases to a high enough value (i.e., a predetermined threshold value) during an ESD event, then the $n^+$ drain region/p-substrate junction of pulldown device 28 will break down, and enter into a "snapback" mode. In "snapback" mode, device 28 operates as a parasitic lateral npn bipolar transistor with base current being supplied by holes generated by impact ionization near the drain region of the channel. As shown in FIG. 2, for pulldown FET $28_1$, a lateral npn bipolar transistor $44_1$ is formed during snapback. Once the pulldown FET $28_1$ snaps back, it has a low resistance and will conduct a significant portion of the ESD current. It is difficult to achieve acceptable ESD failure thresholds when the n-channel output device 28 snaps back due to nonuniformities of current flow.

Reference is now made to FIG. 4 to more fully appreciate the failure mechanism resulting from snapback. When the drain voltage reaches $V_{t1}$, the device triggers into snapback. With sufficient current flowing in the snapback region, the device triggers into second breakdown (i.e., thermal runaway and current instability). Current flow through the snapback region is substantially uniform, and does not generally cause device failure. However, current flow indicated in the second breakdown region may form a "current filament"; this nonuniform current flow causes the device to fail, with a source-to-drain short. In the context of a multi-finger architecture, the failure threshold of the device is determined by the number of "fingers" (i.e., individual n-channel FETs $28_1$, $28_2$, . . . $28_N$) that are turned-on and conducting in the snapback region before second breakdown occurs. That is, the greater the number of individual transistors carrying the ESD charge, the lower the likelihood of device failure due to current damage.

One approach taken in the art for remedying the above-identified second breakdown device failure mode calls for disposing a polysilicon or silicide resistor between the I/O pad 16 and the drain region of n-channel pulldown device 28. Although this approach was found to be satisfactory in terms of increasing the ESD failure threshold, as compared to a design without a resistor, the approach had the significant disadvantage in that such a resistor could not be integrated into a structure, such as the structure shown in FIG. 2, which merges the drain of n-channel pulldown FET 28, and the cathode of diode $D_1$. This approach is thus not very compact.

Another disadvantage in the prior art as shown in FIG. 1 and 2, is that it requires the power supply bus $V_{SSI}$ to be connected to diode $D_1$. Therefore, $V_{SSI}$ must be routed to the I/O cell. Further, the metal width of the $V_{SSI}$ bus must be large enough to carry the current during an ESD event without fusing open. For example, the design rules for one fabrication process dictates that the metal bus width must be 15 μm. The requirement that the $V_{SSI}$ power supply bus be routed to the I/O cell, with a significant width, can lead to a significant increase in the cell area, or, the die area.

Accordingly, there is a need to provide an improved ESD protection circuit suitable for use in an integrated circuit, that minimizes or eliminates one or more of the problems as set forth above.

SUMMARY OF THE INVENTION

It is an object of the present invention to provide protection against electrostatic discharge (ESD) on input/output (I/O) pins on an integrated circuit device. It is a further object of the present invention to provide a protection circuit against ESD on I/O pins that permits an efficient and compact layout. It is yet a further object of the present invention to provide a protection circuit against ESD on I/O pins that provides more uniform current distribution through the pulldown FET during ESD events.

To achieve these and other objects, and in accordance with a first aspect of the present invention, an interface structure for use with an interface pad of a semiconductor device is provided employing a source-side series resistor for the pulldown FET. The structure includes three major portions: a pulldown field effect transistor (FET) formed in a semiconductor substrate (preferably p-type), an ohmic contact region (preferably $p^+$), and a resistor.

The pulldown FET includes source and drain regions having a conductivity type (preferably $n^+$) opposite that of the substrate, wherein the source and drain regions are spaced apart to define a channel region therebetween. The drain region of the pulldown FET is connected to the interface pad while the $p^+$ ohmic contact region is laterally spaced from and adjacent to the drain region of the pulldown FET and is connected to a power supply bus $V_{SSI}$.

The $p^+$ contact region, and the $n^+$ drain region define a junction, or in other words, a diode, for shunting ESD charge at the interface pad. The pulldown FET, and diode, thus have the $n^+$ region in common, and are thus merged in a preferred embodiment. The resistor, which may be formed using polysilicon, is connected between the source of the pulldown FET and $V_{SSO}$. The voltage drop through this added series resistor during an ESD event increases the voltage observed at the interface pad, which tends to force a fraction of the ESD current to flow through a second diode to a positive power supply bus $V_{DD}$. This reduces the current flowing through the pulldown FET. Further, the source-side series resistor provides for more uniform current distribution through the pulldown FET. More uniform current results because the voltage drop across such a resistor for fingers which tend to carry more current is itself larger, which reduces the corresponding voltage drop across the FET finger itself. Moreover, since the pulldown FET, and diode between the interface pad and $V_{SSI}$ are "merged," layout efficiency and compactness is retained.

In a second aspect of the present invention, another interface structure for use with an interface of a semiconductor device is provided by employing an n-well for substrate isolation. The structure includes three main portions: a pulldown FET, a contact region, and a well region. The pulldown FET, and $p^+$ contact region are substantially the same as in the first aspect of the invention with the following difference: the $p^+$ contact region is connected to $V_{SSO}$.

The well region is preferably fabricated n-conductivity type and is provided for isolating the $p^+$ contact from the substrate. To achieve this function, the n-well region partially overlaps the $n^+$ drain region of the pulldown FET, and, wholly overlaps the $p^+$ contact region (thus isolating it from the substrate). The $p^+$ contact region, and the n-well, define a junction. This junction (by way of $n^+$ drain region) provides a diode function during ESD events shunting charge to $V_{SSO}$. Moreover, the $p^+$ region and the n-well junction further provide for increasing a substrate resistance between a channel of the pulldown FET and $V_{SS}$ during ESD events. The increased substrate resistance translates to a corresponding increase in a substrate potential during "snapback" mode. This increased substrate potential tends to forward bias the base-emitter junction of adjacent parasitic npn bipolar devices proximate the particular pulldown FET that is in snapback. As a result, the structure effectively causes increasing numbers of alternate "fingers" to operate, thus providing for more uniform current flow, and accordingly, increasing the ESD failure threshold of the device. As a further benefit, the $p^+$ contact is isolated from the p-conductivity type substrate (which is connected to the internal power supply bus $V_{SSI}$) by the n-well. This structure thus permits the $p^+$ contact to be connected to the output ground power supply ($V_{SSO}$), thus eliminating the need to route the metal power supply bus $V_{SSI}$ to the I/O cell. Cell area, and, die area are thus reduced.

Other objects, features, and advantages of the present invention will become apparent to one skilled in the art from the following detailed description and accompanying drawings illustrating features of this invention by way of example, but not way of limitation.

DETAILED DESCRIPTION OF THE PREFERRED EMBODIMENTS

Figure 1:
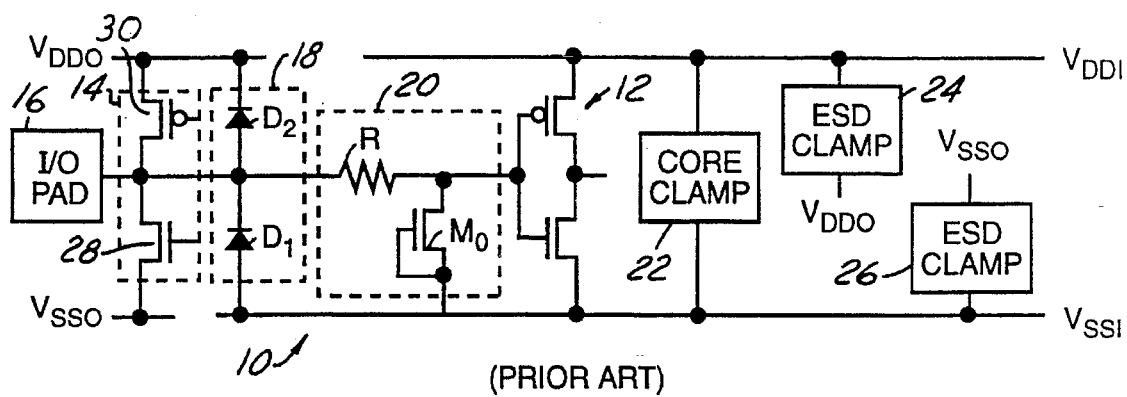
FIG. 1 is a simplified schematic drawing of protection circuitry employed in the prior art in connection with an input/output (I/O) pad of a semiconductor device.
Figure 2:
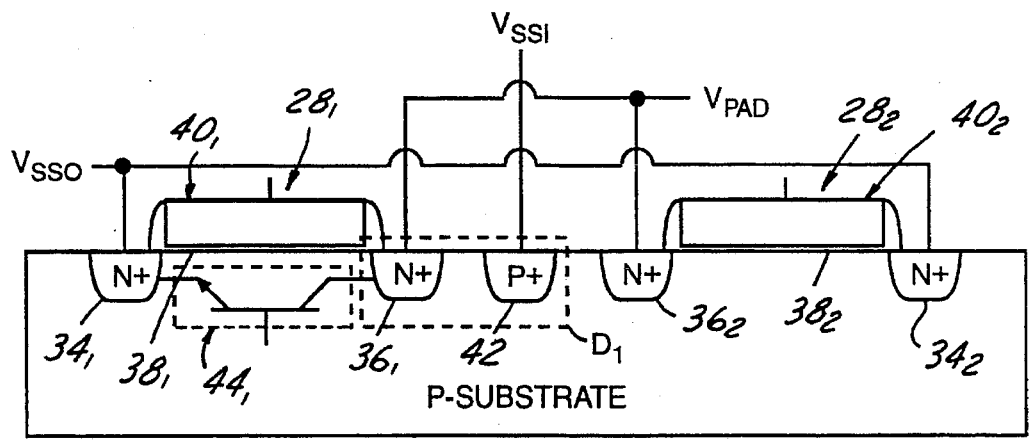
FIG. 2 is a simplified, exaggerated cross-sectional view of a semiconductor structure taken substantially along lines 2—2 of FIG. 3, illustrating a conventional ESD protection structure.
Figure 5:
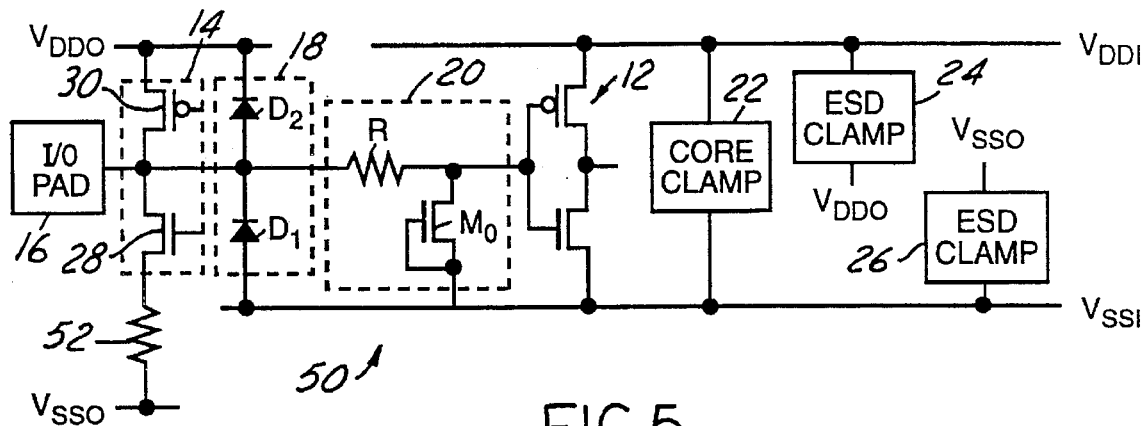
FIG. 5 is a simplified equivalent circuit schematic and block diagram view of a first protection circuit embodiment of the present invention, particularly a source-side resistance connected in series with a pulldown field effect transistor (FET).

Referring now to the drawings wherein like referenced numerals are used to identify identical components in the various views. FIG. 5 shows an interface structure 50 in which the present invention may be advantageously employed. The structure 50 includes input buffer 12, output driver 14, I/O pad 16, primary ESD protection circuit 18, secondary ESD protection circuit 20, core clamp 22, and ESD clamps 24, and 26. Output driver 14 is connected between power supplies $V_{DDO}$ and $V_{SSO}$ and includes n-channel pulldown device 28, and p-channel pullup device 30, having a common node connected to I/O pad 16. Primary ESD protection circuit 18 includes stacked diodes $D_1$ and $D_2$. Diodes $D_1$ and $D_2$ provide a clamping function for limiting a voltage potential on pad 16, as is well-known and conventional in the art. The structure 50 is generally similar to structure 10, as shown in FIG. 1 and discussed in detail in the Background section. In particular, diode $D_2$ is merged with pullup device 30, and diode $D_1$ is merged with pulldown 28.

Figure 6:
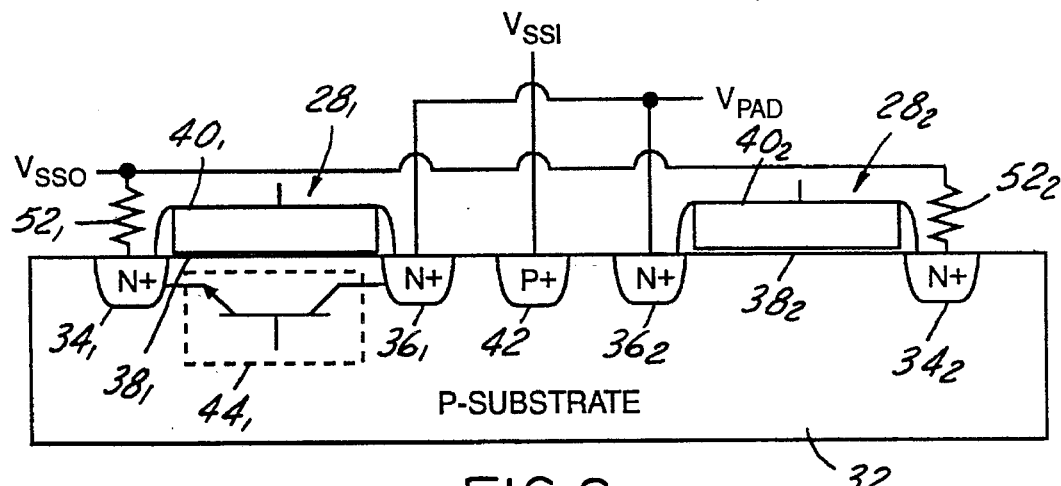
FIG. 6 is a simplified, exaggerated cross-sectional view of a semiconductor structure corresponding to a portion of the protection circuit shown in FIG. 5.

Referring now to FIG. 6, the present invention is suitably adapted for application in an architecture that employs a plurality of pulldown FETs $28_1$, $28_2$, ... $28_N$, to implement pulldown device 28, shown schematically as a single device in FIG. 5. FIG. 6 shows two such pulldown FETs $28_1$, and $28_2$.

Structure 50 further includes means, such as a resistance element 52, disposed between the source of pulldown device 28, and power supply bus $V_{SSO}$ for ensuring uniform current flow through pulldown device 28. FIG. 6 shows an implementation of the invention that uses a separate resistor $52_i$. connected to each pulldown FET sources $34_i$ in a multiple "finger" architecture. In particular, FIG. 6 shows resistor $52_1$. connected between $n^+$ source region $34_1$ and $V_{SSO}$, and second resistor $52_2$ connected between second $n^+$ source region $34_2$ and $V_{SSO}$. In an alternative embodiment of this aspect of the present invention, a single resistor 52 may be used to connect all pulldown FET sources $34_i$ to power supply bus $V_{SSO}$. In a further embodiment, several resistors 52 are used, each being connected between a group of pulldown FET sources and $V_{SSO}$, wherein each group itself contains a plurality of pulldown FETs 28.

It should be understood that use of resistors on the source side of pulldown FET 28 permit the pulldown FET/diode $D_1$ merged structure to be retained (i.e., common $n^+$ region 36).

Figure 7:
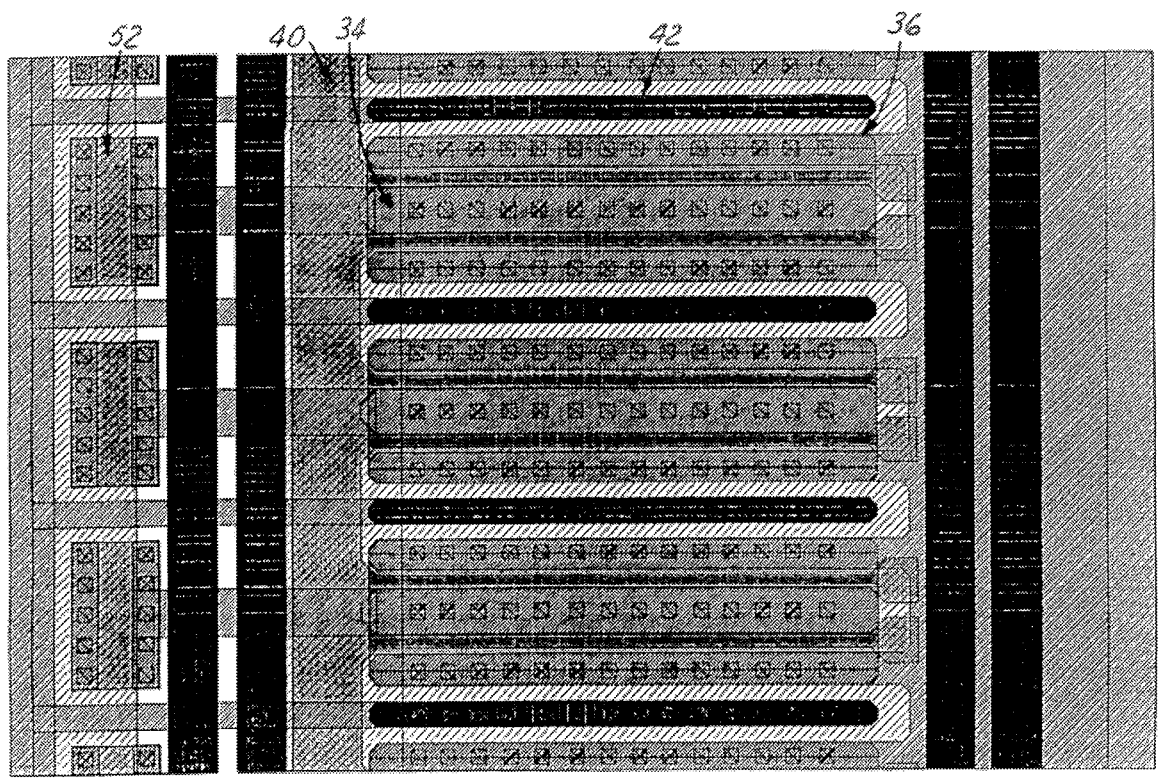
FIG. 7 is a partial, top layout view corresponding to the semiconductor structure shown in FIG. 6.

FIG. 7 shows a layout view corresponding to the section view of FIG. 6 for a constructed embodiment of the present invention. The layout shows part of pulldown FET 28, including resistors 52 connected to $V_{SSO}$, and the merged $n^+$ pulldown FET drain/diode cathode 36.

Resistors 52 may be made using unsilicided polycrystalline silicon, although other resistive materials may be used and remain within the spirit and scope of the invention. In the constructed embodiment, two composite resistance values were used: 1 ohm, and 2 ohms. It should be appreciated, however, that since the plurality of resistors 52 (e.g., resistor $52_1$, $52_2$, ... $52_N$) are arranged in a parallel configuration, that the individual resistance associated with each resistor 52 is much larger than the composite, equivalent resistance of all of the resistors in parallel.

In operation, an interface structure employing a source-side resistor in accordance with the present invention operates as follows. During a positive polarity ESD event (with respect to $V_{SSO}$) on a pin connected to I/O pad 16, charge is transferred to the pad 16, wherein the voltage on the I/O pad 16 increases. In connection with this voltage rise, it is helpful to appreciate that, due to manufacturing tolerances, there exists a slight scatter in the individual breakdown threshold voltages of each of the individual pulldown FETs $28_i$. Accordingly, if such voltage increases to a predetermined threshold voltage, a first one of the plurality of individual n-channel pulldown FETs $28_i$ having the lowest breakdown voltage may break down, and snapback. For illustration purposes, assume that pulldown FET $28_1$ breaks down and enters snapback mode. In snapback mode, FET $28_1$ operates as a lateral npn bipolar transistor, such as bipolar transistor $44_1$ (as shown schematically in FIG. 6)

with base current being supplied by holes generated by impact ionization at drain region $36_1$. In the absence of resistor $52_1$, the n-channel pulldown FET $28_1$, which may have silicided source/drain diffusion regions, can fail due to current nonuniformities (i.e., if not enough other FETs $28_1$ are on and conducting).

The resistor $52_1$ connected between n+ source $34_1$, and power supply bus $V_{SSO}$ improves ESD failure threshold levels in two ways. First, resistor $52_1$ adds series resistance in the path of ESD current flowing from the pad 16, through pulldown FET $28_1$, to power supply bus $V_{SSO}$. This additional resistance creates a voltage drop which increases the voltage on pad 16 during the ESD event. If the voltage on pad 16 is increased sufficiently, some fraction of the ESD current will flow through diode $D_2$ to power supply bus $V_{DDO}$, and will subsequently flow to power supply bus $V_{SSO}$ through the power supply ESD protection structures. Because part of the ESD current flows to power supply bus $V_{DDO}$, the amount of current flowing through pulldown device 28 is reduced, and its ESD failure threshold is increased thereby. Moreover, as further benefit, the increase of the voltage potential on pad 16 operates to further cause alternate "fingers" (i.e., other individual pulldown FETs $28_i$, such as $28_2$) to breakdown and enter snapback, proceeding finger by finger until the remainder of the individual FETs $28_i$ are conducting in snapback (as opposed to second breakdown, which may be too late), thereby causing the current to be more uniform through the pulldown device 28 as a whole.

The second way in which the resistor 52 improves the ESD failure threshold is by making the current distribution through the pulldown FET 28 more uniform. With separate, but identical valued resistors, on each finger $28_i$ of the pulldown device 28, the effect of any nonuniformities between FET fingers is reduced. The resistor, provide negative feedback by producing a larger voltage drop across the resistor for fingers which tend to carry larger currents, thereby reducing the voltage drop across the FET finger itself.

In the prior art configuration shown in FIG. 1, the human body model (HBM) ESD failure threshold, for a particular test die, exhibited a median ESD failure threshold voltage of approximately 2750 volts. By including resistor $52_i$ for each finger (i.e., individual pulldown FET $28_i$), having a composite, equivalent resistance value of 2 ohms, the median ESD failure threshold voltage was increased to approximately 4400 volts.

Figure 8:
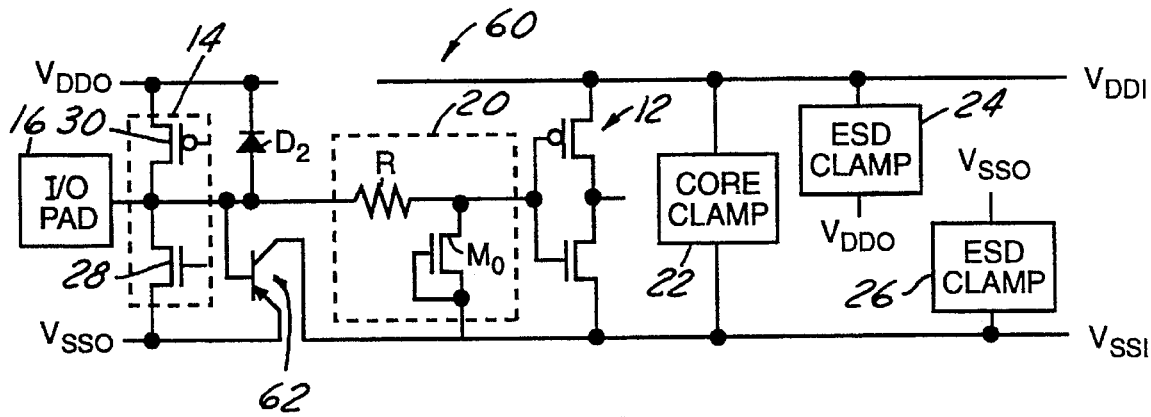
FIG. 8 is simplified equivalent circuit schematic and block diagram view of second protection circuit embodiment of the present invention, particularly illustrating an n-well isolating a $p^+$ contact from a p-substrate.

Referring now to FIG. 8, an interface structure 60 is shown as another environment in which a second embodiment of the present invention may be suitably employed. Structure 60 is substantially identical to structure 50 shown in FIG. 5, except that diode $D_2$ has been replaced with means, such as a pnp type bipolar transistor structure 62 for clamping a voltage potential on pad 16 to a predetermined level, and for ensuring uniform current flow through pulldown device 28. Also, the emitter of transistor 62 is connected to power supply bus $V_{SSO}$, rather than power supply bus $V_{SSI}$. Diode $D_1$ remains merged with pullup device 30.

Figure 9:
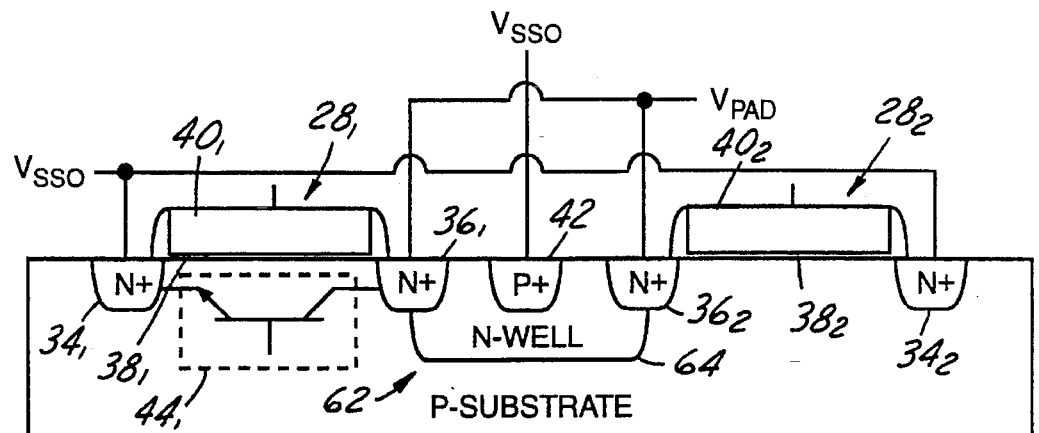
FIG. 9 is a simplified, exaggerated cross-sectional view of a semiconductor structure corresponding to a portion of the protection circuit shown in FIG. 8.

Referring now to FIG. 9, a cross-sectional view of a semiconductor structure used to implement the second embodiment of the present invention is illustrated. Connection of this protection structure to power supply bus $V_{SSO}$ is made possible by formation of an n-well 64. The n-well 64 is formed in substrate 32 and partially overlaps drain regions $36_1$ and $36_2$, and wholly overlaps p+ region 42. P+ contact 42, and n-well 64 (by way of n+ 36) define a junction that performs the same basic function of diode $D_2$ included in the first embodiment, shown in FIG. 5. The n-well 64 isolates p+ contact 42 from substrate 32, while permitting the merged pn junction/pulldown FET drain structure to be retained. Accordingly, the emitter-base junction of pnp transistor 62 can be connected to power supply bus $V_{SSO}$ without shorting out to substrate 32, which is connected to power supply bus $V_{SSI}$ (by connections that are not shown in FIG. 9). Since n-well 64 isolates p+ region 42 from p-substrate 32, it permits a reduced layout area design. N-well 64 is conventional, and well-known, as regards to fabrication details.

Figure 10:
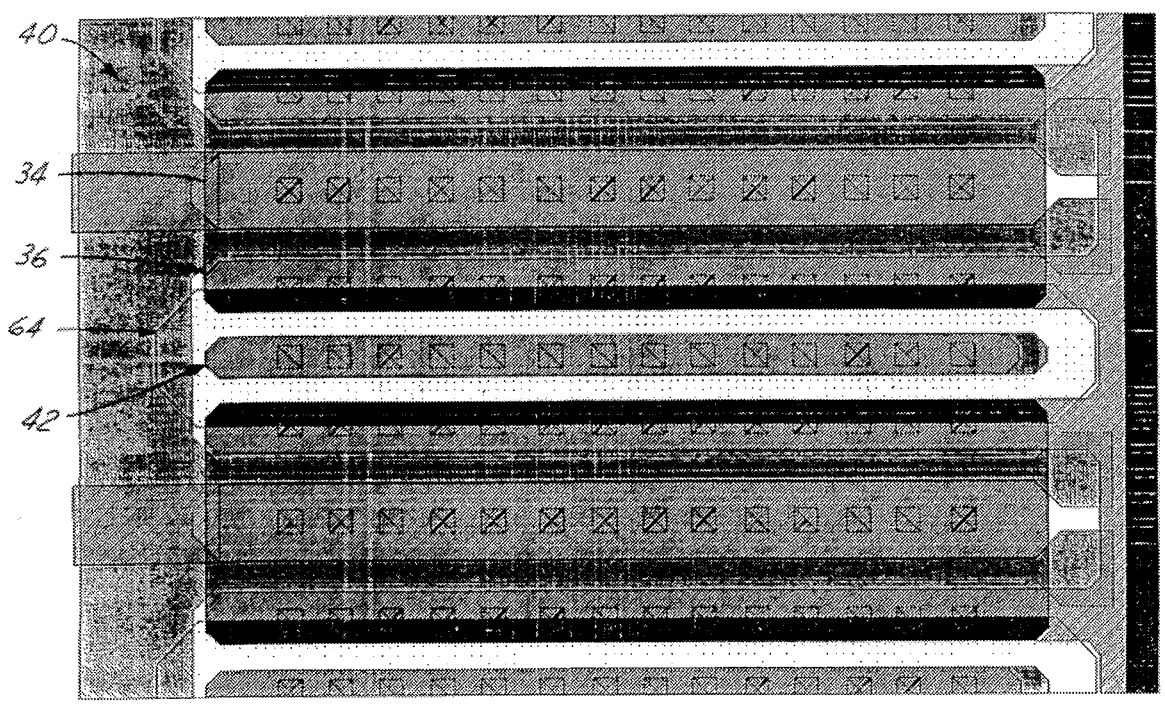
FIG. 10 is simplified, top layout view corresponding to the semiconductor structure shown in FIG. 9.

FIG. 10 shows a top layout view corresponding to the cross-section view shown in FIG. 9.

In operation, the second embodiment of the present invention operates as follows. During a positive polarity ESD zap on an I/O pin (which is connected to I/O pad 16), ESD charge is transferred from pad 16 to power supply bus $V_{DDO}$ through diode $D_2$. Depending on the reference for such an ESD zap, the ESD charge can then be transferred from power supply bus $V_{DDO}$ to any other power supply bus, if necessary through core clamp 22, and/or ESD clamps 24, and 26.

During a negative polarity ESD zap, the ESD charge is transferred from I/O pad 16 to power supply bus $V_{SSO}$ through the emitter-base junction of pnp transistor 62. Depending on the reference for this ESD zap, the ESD charge can then be transferred from power supply bus $V_{SSO}$ to any other power supply bus, if necessary through core clamp 22, and/or ESD clamps 24, and 26. Secondary ESD protection circuit 20 operates in a conventional fashion by clamping the voltage across the gate oxides of input buffer 12, to prevent failure of the gate oxides. In terms of the destination of ESD charge, the second embodiment of the present invention differs from the conventional structure insofar as the ESD charge is transferred to power supply bus $V_{SSO}$, rather than power supply bus $V_{SSI}$ during a negative polarity ESD zap.

With continued reference to FIG. 9, when a voltage potential on I/O pad 16 reaches a positive threshold value during a positive polarity ESD zap (with respect to $V_{SSO}$), n-channel pulldown device 28 may experience break down, and enter into a snapback mode. As discussed above, each individual n-channel pulldown FET $28_1$, $28_2$, ... $28_N$ in snapback operates as a lateral npn bipolar transistor, such as bipolar transistor $44_1$. The base current for transistor $44_i$ is supplied by holes generated by impact ionization at the drain end of the respective channel; that is, near n+ region $36_i$. In snapback mode, which may lead to second breakdown, n-channel pulldown device 28 is susceptible to failure due to nonuniform current flow, especially when source/drain diffusion regions are silicided.

Figure 4:
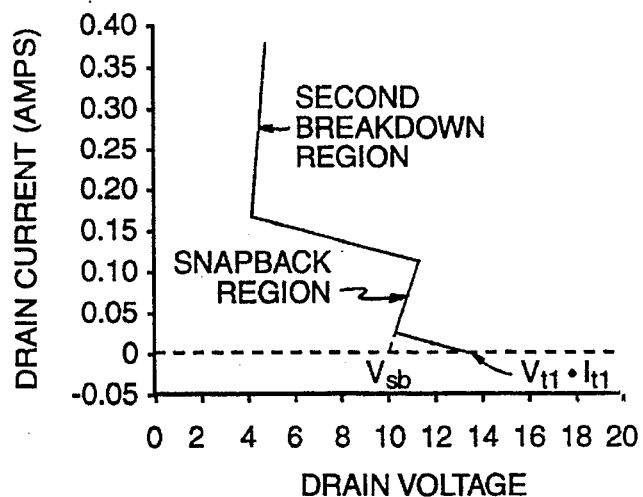
FIG. 4 is a simplified, voltage versus current graph view corresponding to the characteristics of a pulldown field effect transistor shown in section in FIG. 2, particularly illustrating a "snapback" region, and a second breakdown region of operation.
Figure 3:
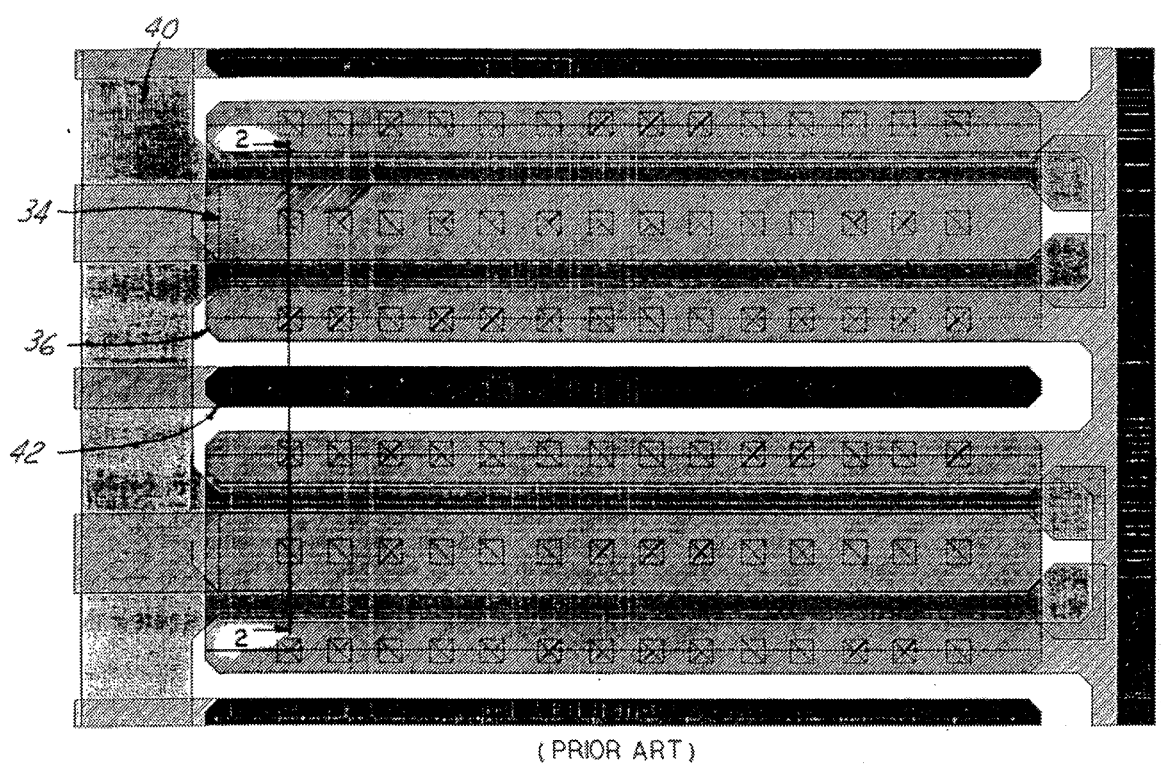
FIG. 3 is a simplified, top layout view corresponding to a portion of the output drive circuitry shown in FIG. 1.

The n-well 64 addresses nonuniform current flow by providing the means for causing alternate pulldown FETs $28_i$ to operate during snapback. The isolation of the p+ region 42, from substrate 32, in the present invention, improves the uniformity of the current flow through pulldown device 28 operating in snapback by increasing the substrate resistance from the channel region of FET 28 to power supply bus $V_{SS}$. In particular, in conventional structures, holes generated by impact ionization near drain 36 are presented with a relatively low resistance path to ground by way of a path through p-substrate 32, and p+ region 42. With the inclusion of n-well 64, these holes see a much increased resistance to power supply bus $V_{SS}$. In particular, holes must now cross a junction defined by p+ region 42, and n-well 64. Alternatively, holes can flow through the FET channel to source region 34. However, such carrier transient to source 34 occurs only when the substrate potential is such as to forward bias the PN junction formed by p-substrate 32/n+ region 34. Thus, provision of n-well 64 results in an increase in the substrate potential. This higher substrate potential, during snapback, improves the uniformity of current flow through pulldown device 28, and thereby increases the ESD failure threshold. Improved uniformity of current flow results from the fact that the increased substrate potential forward biases base-emitter junctions of the adjacent lateral bipolar transistors 44, proximate the FET or FETs 28, in snapback. Accordingly, such action leads to more "fingers" being turned-on to carry the ESD charge, thereby avoiding the second breakdown region (illustrated in FIG. 4) that generally results in a device failure.

Conventional protection structures, such as those shown in FIG. 1, have exhibited an ESD failure threshold voltage in the range of 2475–2860 volts. Provision of n-well 64 improved the ESD failure threshold voltages to a level in the range of 3163–3960 volts.

Figure 11:
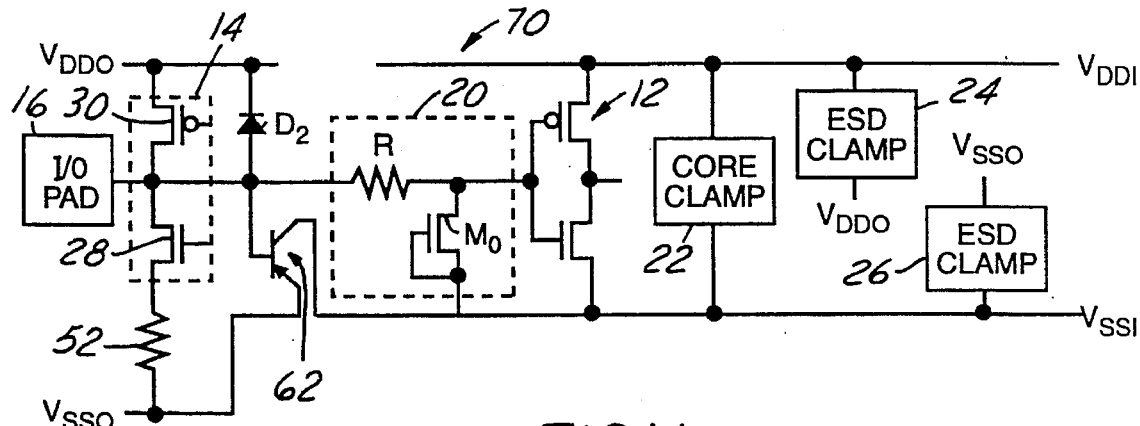
FIG. 11 is a simplified, equivalent circuit schematic and block diagram view of a third protection circuit embodiment of the present invention employing a source-side resistor and an n-well.
Figure 12:
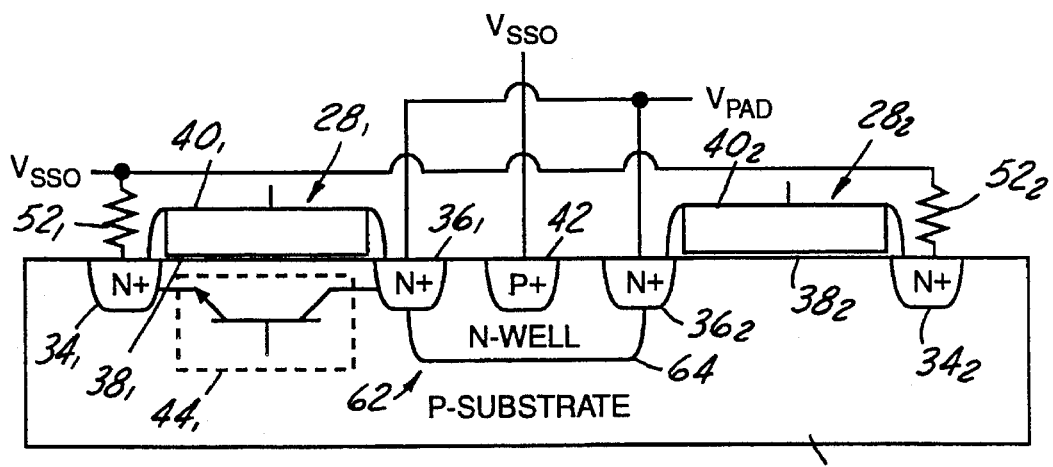
FIG. 12 is a simplified, exaggerated cross-sectional view of a semiconductor structure corresponding to the embodiment of FIG. 11.

It should be appreciated that both the first embodiment of the present invention (i.e., the source-side series resistor) and the second embodiment of the present invention (the addition of n-well 64) may be used together. This third embodiment is shown in FIGS. 11 and 12. Structure 70 is substantially identical to structure 60, (except it includes resistor 52), and includes protection circuitry that employs both n-well 64 and resistor 52. In constructed embodiments, n-well 64 was used in connection with a 1 ohm composite resistance for resistor 52, and a 2 ohm resistance for resistor 52, respectively. For purposes of comparison, the prior art structure, illustrated in FIG. 1, exhibited a median ESD failure threshold voltage of approximately 3300 volts. The combination of the first and second embodiments of the present invention, using 1 ohm, and 2 ohm resistance values, resulted in median ESD failure threshold voltages of approximately 5500, and 4400 volts, respectively.

While the invention has been particularly shown and described with reference to the preferred embodiments thereof, it is well understood by those skilled in the art that various changes and modifications can be made in the invention without departing from the spirit and scope of the invention.

I claim:

1. An interface structure for use with an interface pad of a semiconductor device, comprising:
    a first pulldown field-effect transistor (FET) formed in a semiconductor substrate of a first conductivity type, said first pulldown FET having source and drain regions of a second conductivity type opposite said first conductivity type formed in said substrate, said source and drain regions being spaced apart to define a channel region therebetween, said drain region being connected to said interface pad;
    a contact region of said first conductivity type formed in said substrate and laterally spaced from said drain region, said contact being connected to a power supply bus having a first potential; and,
    a well region of said second conductivity type formed in said substrate for isolating said contact from said substrate, said well region overlapping said drain region and wholly overlapping said contact region, said contact and said well defining a junction for increasing a substrate resistance between said channel and said power supply bus during an electrostatic discharge (ESD) event at said pad.

2. The structure of claim 1 further including a second pulldown FET in parallel with said first pulldown FET, said second pulldown FET including spaced source and drain regions of said second conductivity type, said well region overlapping said drain region of said second pulldown FET.

3. The structure of claim 1 further including a resistor connected between said source and said power supply bus.

4. The structure of claim 3 wherein said resistor has an equivalent resistance in the range of 1–2 ohms.

5. The structure of claim 1 wherein said first conductivity type is p-type, said second conductivity type is n-type, and said first potential is ground potential.

6. The structure of claim 1 wherein said power supply bus is associated with interface circuitry of said device, and said substrate is connected to a second power supply bus having said first potential that is associated with internal circuitry of said device.

7. An interface structure for use with an interface pad of a semiconductor device, comprising:
    a first pulldown field-effect transistor (FET) formed in a semiconductor substrate of a first conductivity type, said first pulldown FET having source and drain regions of a second conductivity type opposite said first conductivity type formed in said substrate, said source and drain regions being spaced apart to define a channel region therebetween, said drain region being connected to said interface pad;
    an ohmic contact region of said first conductivity type formed in said substrate and laterally spaced from said drain region, said contact being connected to a first power supply bus having a first potential, said contact region and said drain region defining a junction for shunting electrostatic discharge (ESD) events at said pad; and,
    a first resistor connected between said source and a second power supply bus having said first potential.

8. The structure of claim 7 further including a second pulldown FET in parallel with said first pulldown FET, said second pulldown FET including spaced source and drain regions of said second conductivity type, said structure further including a second resistor connected between said source region of said second pulldown FET and said second power supply bus.

9. The structure of claim 7 further including a second pulldown FET in parallel with said first pulldown FET, said second pulldown FET including spaced source and drain regions of said second conductivity type, said first resistor being further connected between said source of said second pulldown FET and said second power supply bus.

10. The structure of claim 9 wherein said first and second pulldown FETs define a first plurality of FETs, said structure further including a second plurality of pulldown FETs wherein each one of said second plurality is in parallel with said first and second pulldown FETs, each one of said second plurality of pulldown FETs including spaced source and drain regions of said second conductivity types, said structure further comprising a second resistor connected between said sources of said second plurality of pulldown FETs and said second power supply bus.

11. The structure of claim 7 wherein said first conductivity type is p-type, said second conductivity type is n-type, and said first potential is ground potential.

12. The structure of claim 7 wherein said first power supply bus is associated with interface circuitry of said device, and said substrate is connected to a second power supply bus having said first potential that is associated with internal circuitry of said device.

13. An electrostatic discharge (ESD) protection structure for a semiconductor device having an interface pad, comprising:

an output buffer having an active p-channel pull up and n-channel pulldown devices connected between a first power supply bus having a first potential and a second power supply bus having a second potential, respectively, said pull up and pulldown devices each having a respective output connected to said interface pad, said n-channel pulldown devices comprising a plurality of n-channel field effect transistors (FETs) connected in parallel;

clamping means electrically connected between said first power supply bus and said interface pad; and, means coupled between said interface pad and said second power supply bus for clamping said interface to a predetermined potential and for ensuring uniform current flow through said plurality of n-channel FETs during an ESD event at said interface pad to thereby protect said device from damage.

14. The structure of claim 13 wherein said clamping means comprises a diode.

15. The structure of claim 13 wherein said n-channel pulldown device includes spaced n+ conductivity source and drain regions, said source region being coupled to said second power supply bus, said drain region being coupled to said interface pad, and wherein said clamping and uniform current ensuring means comprises a pnp bipolar transistor.

16. The structure of claim 15 wherein said pnp transistor comprises a p$^+$ region formed adjacent to said drain region, and an n-conductivity type well formed to wholly surround said p$^+$ region and to partially overlap said drain region.

17. An electrostatic discharge (ESD) protection structure for a semiconductor device having an interface pad, comprising:

an output buffer having an active p-channel pull up and n-channel pulldown device, said buffer being connected between a first power supply bus having a first potential and a second power supply bus having a second potential, respectively, said pull up and pulldown devices each having a respective output connected to said interface pad, said n-channel pulldown device comprising a plurality of n-channel field effect transistors (FETs) connected in parallel, each n-channel FET having a respective source and drain regions;

first clamping means electrically connected between said first power supply bus and said interface pad;

second clamping means electrically connected between said second power supply bus and said interface pad, said second clamping means including a p+ conductivity type region formed adjacent said drains of said n-channel FETs, said p+ region and said drain regions defining a junction for clamping a potential of said interface pad; and, a resistor interposed between said sources of said n-channel FETs and said second power supply bus for ensuring uniform current flow through said plurality of n-channel FETs during an ESD event at said interface pad.

18. The structure of claim 17 further including at least one further resistor such that each one of said plurality of n-channel FETs has associated therewith a respective resistor connected between its source and said second power supply bus.

19. An electrostatic discharge (ESD) protection structure for a semiconductor device having an interface pad and a multi-rail power supply, comprising:

an output buffer having a p-channel pull up device and an n-channel pulldown device connected between a first power supply bus ($V_{DDO}$) having a first potential and a second power supply bus ($V_{SSO}$) having a second potential, respectively, said pull up and pulldown devices each having a respective output connected to said interface pad, said n-channel pulldown device comprising a plurality of n-channel field effect transistors (FETs) connected in parallel, each n-channel FET having a respective n+ conductivity type source and drain region formed in a semiconductor substrate of said device, said substrate being coupled to a third power supply bus ($V_{SSI}$) having said second potential;

a first diode electrically connected between said first power supply bus ($V_{DDO}$) and said interface pad;

a p$^+$ conductivity type region formed in said substrate adjacent to said n$^+$ drain regions of said n-channel FETs;

means proximate said p+ region for isolating said substrate from said p+ conductivity region for reducing a layout area of said semiconductor device; and, a resistor connected between said source regions of said n-channel FETs and said second power supply bus ($V_{SSO}$).

20. The structure of claim 19 wherein said isolating means includes an n-conductivity type well formed in said substrate and wholly surrounding said p+ region, said well contacting said drain region of said n-channel FETs.

* * * * *